United States Patent
Thombare et al.

(10) Patent No.: US 10,510,590 B2
(45) Date of Patent: Dec. 17, 2019

(54) LOW RESISTIVITY FILMS CONTAINING MOLYBDENUM

(71) Applicant: Lam Research Corporation, Fremont, CA (US)

(72) Inventors: Shruti Vivek Thombare, Sunnyvale, CA (US); Raashina Humayun, Los Altos, CA (US); Michal Danek, Cupertino, CA (US); Chiukin Steven Lai, Sunnyvale, CA (US); Joshua Collins, Sunnyvale, CA (US); Hanna Bamnolker, Cupertino, CA (US); Griffin John Kennedy, Berkeley, CA (US); Gorun Butail, Fremont, CA (US); Patrick A. van Cleemput, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/948,143

(22) Filed: Apr. 9, 2018

(65) Prior Publication Data

US 2018/0294187 A1  Oct. 11, 2018

Related U.S. Application Data

(60) Provisional application No. 62/483,857, filed on Apr. 10, 2017.

(51) Int. Cl.
*H01L 21/44* (2006.01)
*H01L 21/768* (2006.01)
(Continued)

(52) U.S. Cl.
CPC .. *H01L 21/76864* (2013.01); *H01L 21/28562* (2013.01); *H01L 21/28568* (2013.01);
(Continued)

(58) Field of Classification Search
CPC ......... H01L 21/76864; H01L 21/28562; H01L 21/28568
(Continued)

(56) References Cited

U.S. PATENT DOCUMENTS

| 5,502,005 A | * | 3/1996 | Mikagi | ............ H01L 21/76838 257/E21.582 |
| 5,916,634 A | | 6/1999 | Fleming et al. | |

(Continued)

FOREIGN PATENT DOCUMENTS

| CN | 1115723 C | 7/2003 |
| CN | 101154576 A | 4/2008 |

(Continued)

OTHER PUBLICATIONS

P. Majumder et al. Investigation on the Diffusion Barrier Properties of Sputtered Mo/W Thin Films in Cu Interconnects Oct. 18, 2007, American Institue of Physics edition 91, pp. 162106-1-162106-3.*

(Continued)

*Primary Examiner* — David S Blum
(74) *Attorney, Agent, or Firm* — Weaver Austin Villeneuve & Sampson LLP

(57) ABSTRACT

Provided herein are low resistance metallization stack structures for logic and memory applications and related methods of fabrication. In some implementations, the methods involve providing a tungsten (W)-containing layer on a substrate; and depositing a molybdenum (Mo)-containing layer on the W-containing layer. In some implementations, the methods involve depositing a Mo-containing layer directly on a dielectric or titanium nitride (TiN) substrate without an intervening W-containing layer.

20 Claims, 12 Drawing Sheets

(51) Int. Cl.
*H01L 21/285* (2006.01)
*H01L 23/522* (2006.01)
*H01L 27/11582* (2017.01)
*H01L 23/532* (2006.01)
*H01L 27/108* (2006.01)
*H01L 27/11556* (2017.01)

(52) U.S. Cl.
CPC .. *H01L 21/76843* (2013.01); *H01L 21/76876* (2013.01); *H01L 21/76877* (2013.01); *H01L 21/76879* (2013.01); *H01L 23/5226* (2013.01); *H01L 23/53266* (2013.01); *H01L 27/10891* (2013.01); *H01L 27/11556* (2013.01); *H01L 27/11582* (2013.01)

(58) Field of Classification Search
USPC .......................................................... 438/653
See application file for complete search history.

(56) References Cited

U.S. PATENT DOCUMENTS

| | | | |
|---|---|---|---|
| 5,950,108 | A | 9/1999 | Wu et al. |
| 6,162,715 | A | 12/2000 | Mak et al. |
| 6,287,965 | B1 | 9/2001 | Kang et al. |
| 6,491,978 | B1 | 12/2002 | Kalyanam |
| 6,958,174 | B1* | 10/2005 | Klaus ................ C23C 16/08 |
| | | | 427/250 |
| 7,211,144 | B2 | 5/2007 | Lu et al. |
| 7,262,125 | B2 | 8/2007 | Wongsenakhum et al. |
| 7,405,158 | B2 | 7/2008 | Lai et al. |
| 7,589,017 | B2 | 9/2009 | Chan et al. |
| 7,772,114 | B2 | 8/2010 | Chan et al. |
| 7,955,972 | B2 | 6/2011 | Chan et al. |
| 8,058,170 | B2 | 11/2011 | Chandrashekar et al. |
| 9,236,297 | B2 | 1/2016 | Chan et al. |
| 9,583,385 | B2 | 2/2017 | Lee et al. |
| 9,595,470 | B2 | 3/2017 | Bamnolker et al. |
| 9,953,984 | B2 | 4/2018 | Danek et al. |
| 9,969,622 | B2 | 5/2018 | Lei et al. |
| 2001/0003061 | A1 | 6/2001 | Chen et al. |
| 2001/0007797 | A1 | 7/2001 | Jang et al. |
| 2002/0024140 | A1* | 2/2002 | Nakajima ............ H01L 23/485 |
| | | | 257/758 |
| 2003/0194825 | A1 | 10/2003 | Law et al. |
| 2004/0202786 | A1 | 10/2004 | Wongsenakhum et al. |
| 2005/0031786 | A1 | 2/2005 | Lee et al. |
| 2008/0124926 | A1 | 5/2008 | Chan et al. |
| 2009/0004848 | A1 | 1/2009 | Kim et al. |
| 2009/0053893 | A1 | 2/2009 | Khandelwal et al. |
| 2009/0142509 | A1 | 6/2009 | Yamamoto |
| 2009/0149022 | A1 | 6/2009 | Chan et al. |
| 2010/0007797 | A1 | 1/2010 | Stojancic |
| 2010/0062149 | A1 | 3/2010 | Ma et al. |
| 2010/0120245 | A1 | 5/2010 | Tjandra et al. |
| 2010/0213541 | A1* | 8/2010 | Jeon .................. H01L 21/28088 |
| | | | 257/334 |
| 2010/0244260 | A1 | 9/2010 | Hinomura |
| 2012/0009785 | A1 | 1/2012 | Chandrashekar et al. |
| 2012/0225192 | A1 | 9/2012 | Yudovsky et al. |
| 2013/0168864 | A1 | 7/2013 | Lee et al. |
| 2013/0302980 | A1 | 11/2013 | Chandrashekar et al. |
| 2014/0027664 | A1 | 1/2014 | Lei et al. |
| 2014/0073135 | A1 | 3/2014 | Guan et al. |
| 2014/0120723 | A1 | 5/2014 | Fu et al. |
| 2015/0325475 | A1 | 11/2015 | Bamnolker et al. |
| 2015/0354064 | A1 | 12/2015 | Kolics et al. |
| 2016/0233220 | A1 | 8/2016 | Danek et al. |
| 2017/0069527 | A1 | 3/2017 | Haukka et al. |
| 2018/0219014 | A1 | 8/2018 | Danek et al. |

FOREIGN PATENT DOCUMENTS

| | | |
|---|---|---|
| CN | 101308794 A | 11/2008 |
| CN | 103579184 | 2/2014 |
| CN | 104272440 A | 1/2015 |
| CN | 104272441 A | 1/2015 |
| JP | S5629648 A | 3/1981 |
| JP | 2009-024252 | 9/2009 |
| JP | 2016-098406 | 5/2016 |
| WO | WO2016-191432 | 12/2016 |

OTHER PUBLICATIONS

International Search Report and Written Opinion issued in Application No. PCT/US18/26746 dated Jul. 27, 2018.
International Search Report and Written Opinion issued in Application No. PCT/US2018/061803 dated Mar. 8, 2019.
U.S. Office Action dated May 18, 2016 issued in U.S. Appl. No. 14/703,732.
U.S. Notice of Allowance dated Nov. 1, 2016 issued in U.S. Appl. No. 14/703,732.
U.S. Office Action dated Aug. 18, 2016 issued in U.S. Appl. No. 15/040,561.
U.S. Final Office Action dated Dec. 30, 2016 issued in U.S. Appl. No. 15/040,561.
U.S. Office Action dated Jul. 17, 2017 issued in U.S. Appl. No. 15/040,561.
U.S. Notice of Allowance dated Dec. 19, 2017 issued in U.S. Appl. No. 15/040,561.
U.S. Office Action dated Sep. 21, 2018 issued in U.S. Appl. No. 15/925,579.
U.S. Final Office Action dated Mar. 1, 2019 issued in U.S. Appl. No. 15/925,579.
Chinese First Office Action, dated Jun. 1, 2017, issued in Application No. CN 201510236179.5.
Chinese Second Office Action, dated Jan. 30, 2018 issued in Application No. CN 201510236179.5.
Chinese Third Office Action, dated Dec. 29, 2018 issued in Application No. CN 201510236179.5.
Taiwan First Office Action, dated Aug. 17, 2018 issued in Application No. TW 104114532.
Chinese First Office Action dated May 15, 2018 issued in Application No. CN 201610085046.7.
Chinese Second Office Action dated Jan. 8, 2019, issued in Application No. CN 201610085046.7.
Japanese First Office Action, dated Jan. 22, 2019 issued in Application No. JP 2015-095549.
U.S. Office Action, dated May 29, 2015, issued in U.S. Appl. No. 13/949,092.
U.S. Final Office Action, dated Jan. 14, 2016, issued in U.S. Appl. No. 13/949,092.
U.S. Office Action, dated Sep. 19, 2016, issued in U.S. Appl. No. 13/949,092.
U.S. Final Office Action, dated May 18, 2017, issued in U.S. Appl. No. 13/949,092.
U.S. Notice of Allowance, dated Jan. 12, 2018, issued in U.S. Appl. No. 13/949,092.
U.S. Notice of Allowance (Corrected), dated Feb. 7, 2018, issued in U.S. Appl. No. 13/949,092.
Chinese First Office Action dated Sep. 6, 2015 issued in Application No. CN 201310320848.8.
Chinese Second Office Action dated May 16, 2016 issued in Application No. CN 201310320848.8.
Taiwan Examination Report dated Oct. 26, 2016 issued in Application No. TW 102126696.

* cited by examiner

US 10,510,590 B2

LOW RESISTIVITY FILMS CONTAINING MOLYBDENUM

CROSS-REFERENCE TO RELATED APPLICATION

This application claims benefit under 35 U.S.C. § 119 to U.S. Provisional Patent Application No. 62/483,857, filed Apr. 10, 2017, which is incorporated by reference herein.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. Tungsten films may also be used in various memory applications, including in formation of buried wordline (bWL) architectures for dynamic random access memory (DRAM), and logic applications. In an example of bWL deposition, a tungsten layer may be deposited on a titanium nitride (TiN) barrier layer to form a TiN/W bilayer by a CVD process using $WF_6$. However, the continued decrease in feature size and film thickness bring various challenges to TiN/W film stacks. These include high resistivity for thinner films and deterioration of TiN barrier properties.

SUMMARY

One aspect of the disclosure relates to methods including providing a tungsten (W)-containing layer on a substrate; and depositing a molybdenum (Mo)-containing layer on the W-containing layer. In some embodiments, the W-containing layer is a WCN layer. In some embodiments, the W-containing layer is a W nucleation layer. In some embodiments, the W-containing layer is deposited from one or more tungsten chloride precursors. In some embodiments, the Mo-containing layer is a Mo layer having less than 1 (atomic) % impurities. In some embodiments, the method includes thermally annealing the Mo-containing layer. In some embodiments, the Mo-containing layer is deposited by exposing the W-containing layer to a reducing agent and a Mo-containing precursor selected from: molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$). In some embodiments, a substrate temperature during exposure to the Mo-containing precursor is less than 550° C. In some embodiments, the substrate is exposed to the reducing agent at first substrate temperature and is exposed to the Mo-containing precursor at a second substrate temperature, wherein the first substrate temperature is less than the second substrate temperature. In some embodiments, the reducing agent is a mixture of a boron-containing reducing agent and a silicon-containing reducing agent.

Another aspect of the disclosure relates to method including flowing a reducing agent gas to a process chamber housing a substrate, at a first substrate temperature to form a conformal reducing agent layer on the substrate; and exposing the conformal reducing agent layer to a molybdenum (Mo)-containing precursor at a second substrate temperature to convert the reducing agent layer to molybdenum. In some embodiments, the first substrate temperature is less than the second substrate temperature. In some embodiments, the reducing agent is a mixture of a boron-containing reducing agent and a silicon-containing reducing agent. In some embodiments, the first substrate temperature is no more than 400° C. and the second substrate temperature is at least 500° C. In some embodiments, the methods further include annealing the molybdenum.

Another aspect of the disclosure relates to a method including pulsing a reducing agent, wherein the reducing agent is boron (B)-containing, silicon (Si)-containing or germanium (Ge)-containing; and pulsing a Mo-containing precursor, wherein the Mo-containing precursor is reduced by the reducing agent or a product thereof to form a multi-component tungsten-containing film containing one or more of B, Si, and Ge on the substrate. In some embodiments, the multi-component tungsten-containing film contains between 5% and 60% (atomic) B, Si, or Ge. In some embodiments, the between 5% and 60% (atomic) B, Si, or Ge is provided by the reducing agent.

Another aspect of the disclosure are apparatuses for performing the methods disclosed herein. These and other features are discussed further with respect to the drawings.

BRIEF DESCRIPTIONS OF DRAWINGS

Figure 4A:
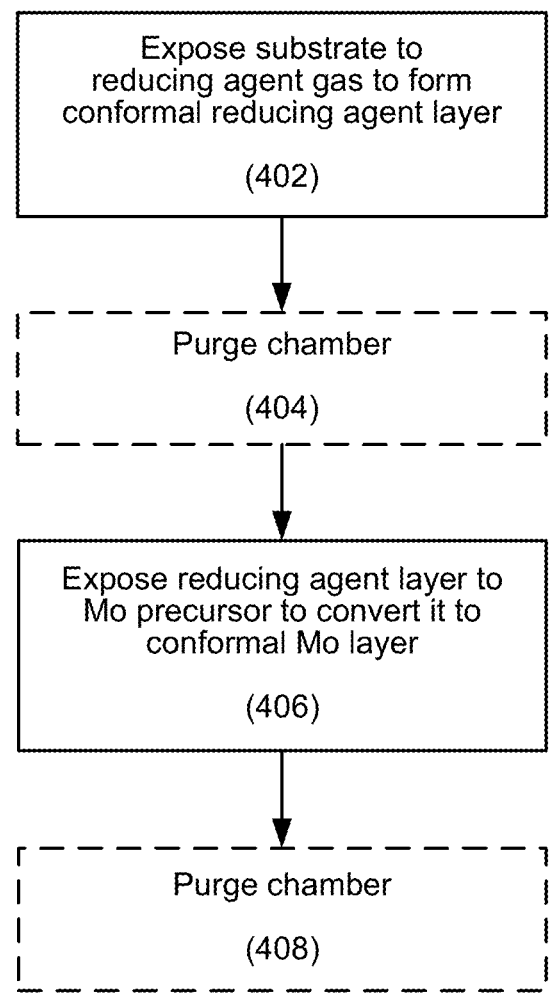
Figure 4B:
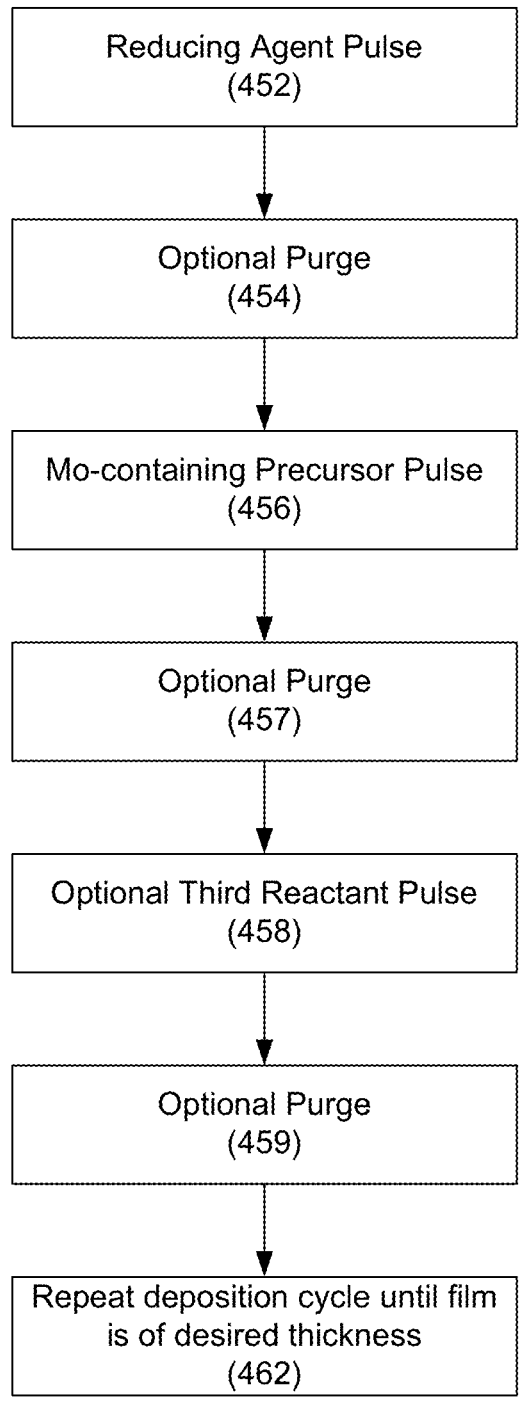

FIGS. 4A and 4B provide process flow diagrams for methods performed in accordance with disclosed embodiments.

Figure 5:
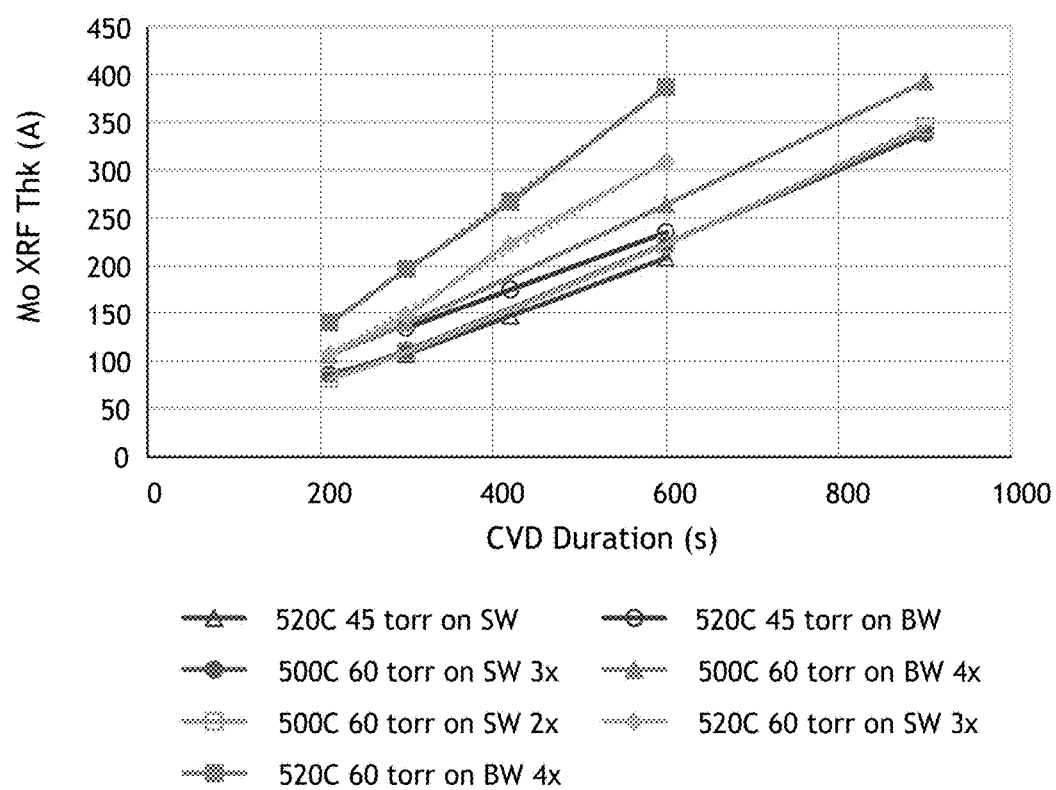
Figure 6:
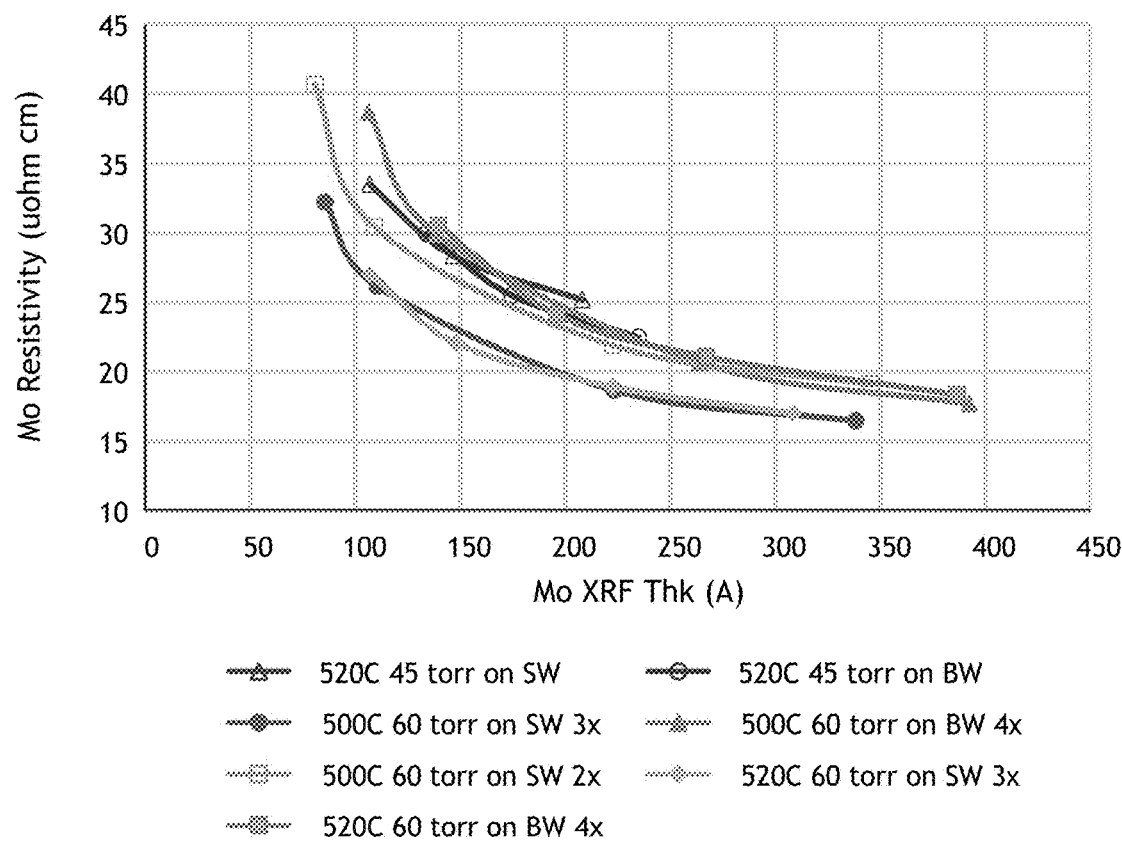

FIGS. 5 and 6 are graphs showing Mo thickness (Angstroms) vs. CVD Duration (seconds) and Mo Resistivity ($\mu\Omega$-cm) vs Mo thickness (Angstroms), respectively, for various substrate temperatures and chamber pressures for CVD deposition of Mo on tungsten (W) nucleation layers.

Figure 7:
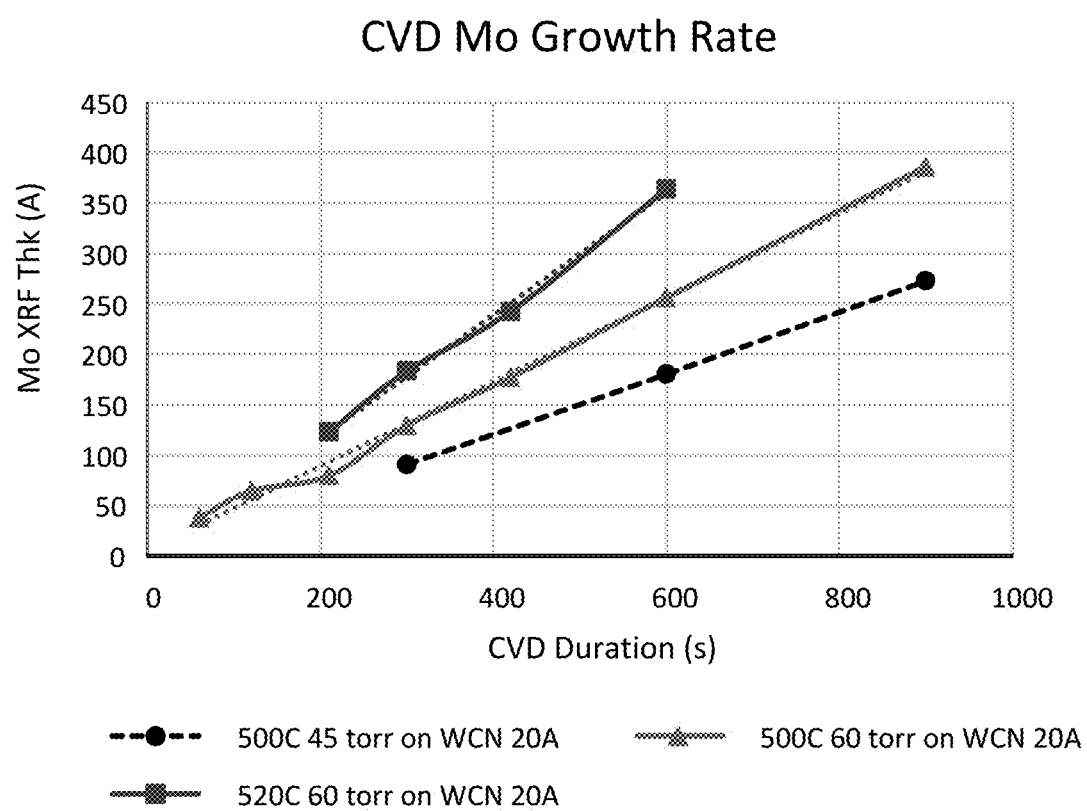
Figure 8:
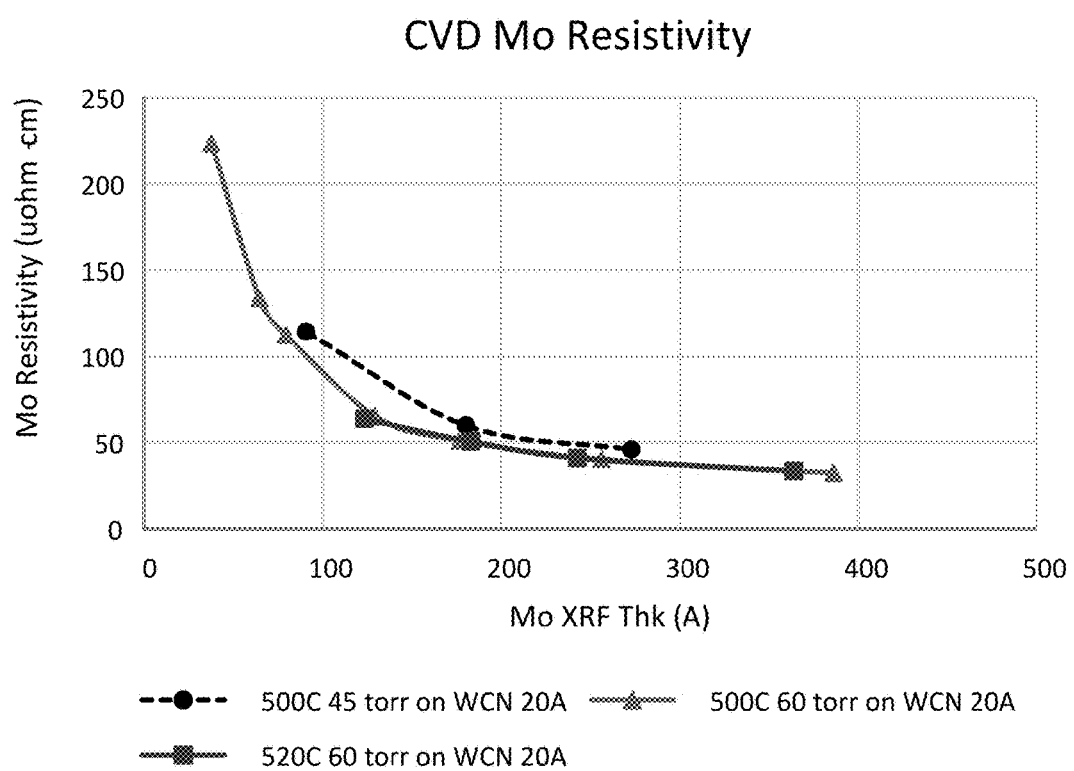

FIGS. 7 and 8 are graphs showing Mo growth rate and resistivity vs Mo film thickness, respectively, for CVD deposition of Mo on WCN at various substrate temperatures and chamber pressures.

Figure 9:
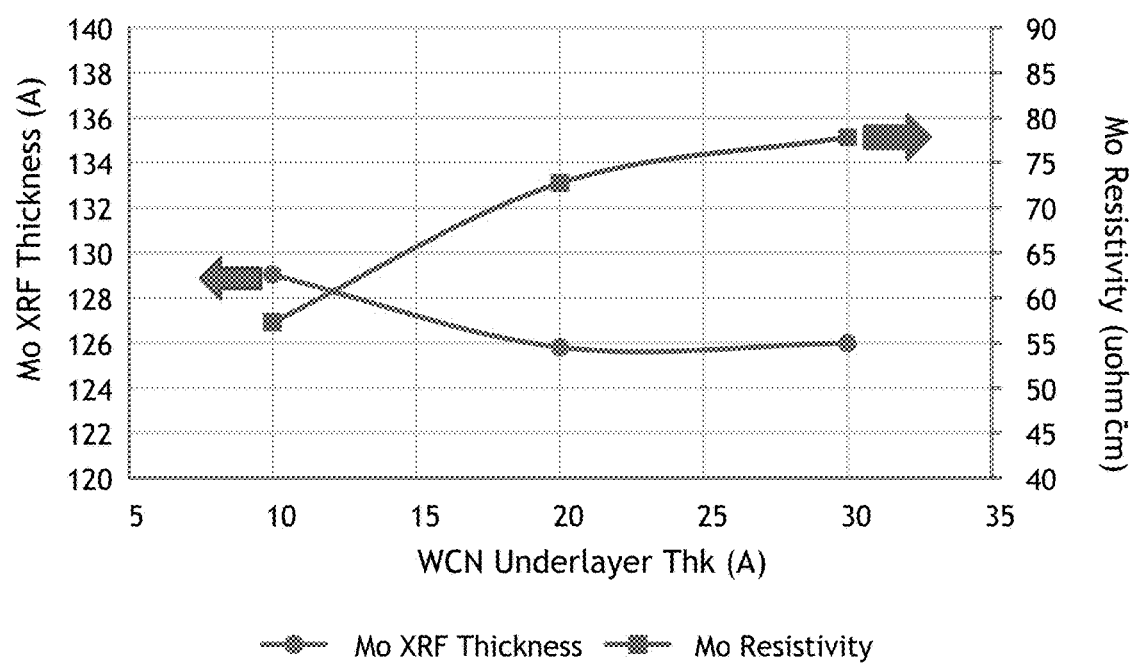

FIG. 9 is a graph showing thickness and resistivity of a CVD deposited Mo layer as a function of WCN underlayer thickness.

Figure 10:
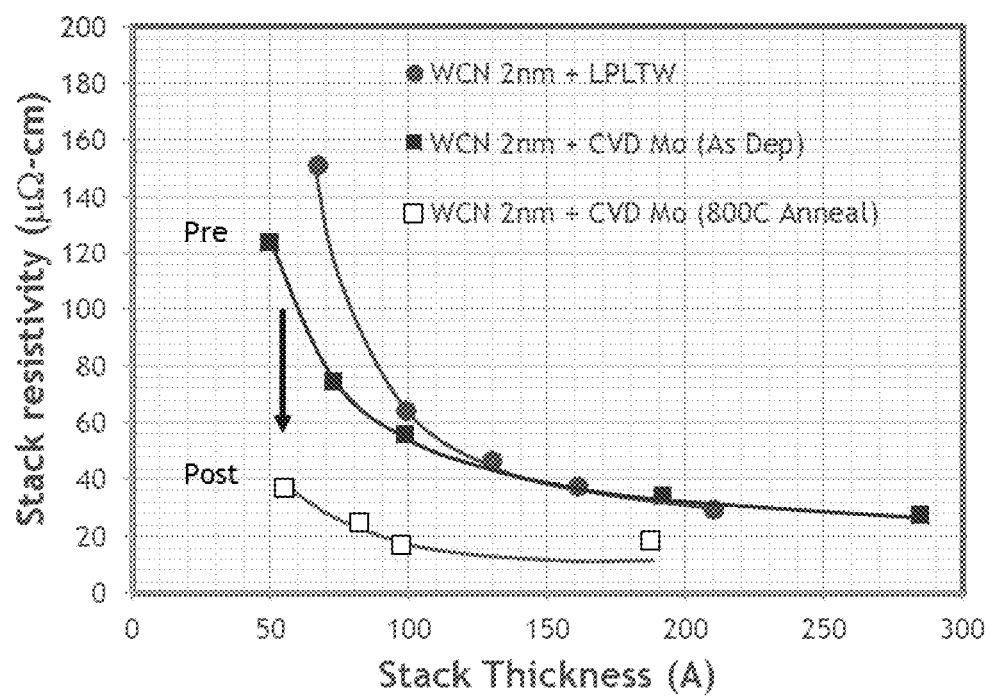

FIG. 10 is a graph showing the reduction in stack resistivity for Mo stacks of various thicknesses deposited on 2 nm WCN after anneal at 800° C.

Figure 11:
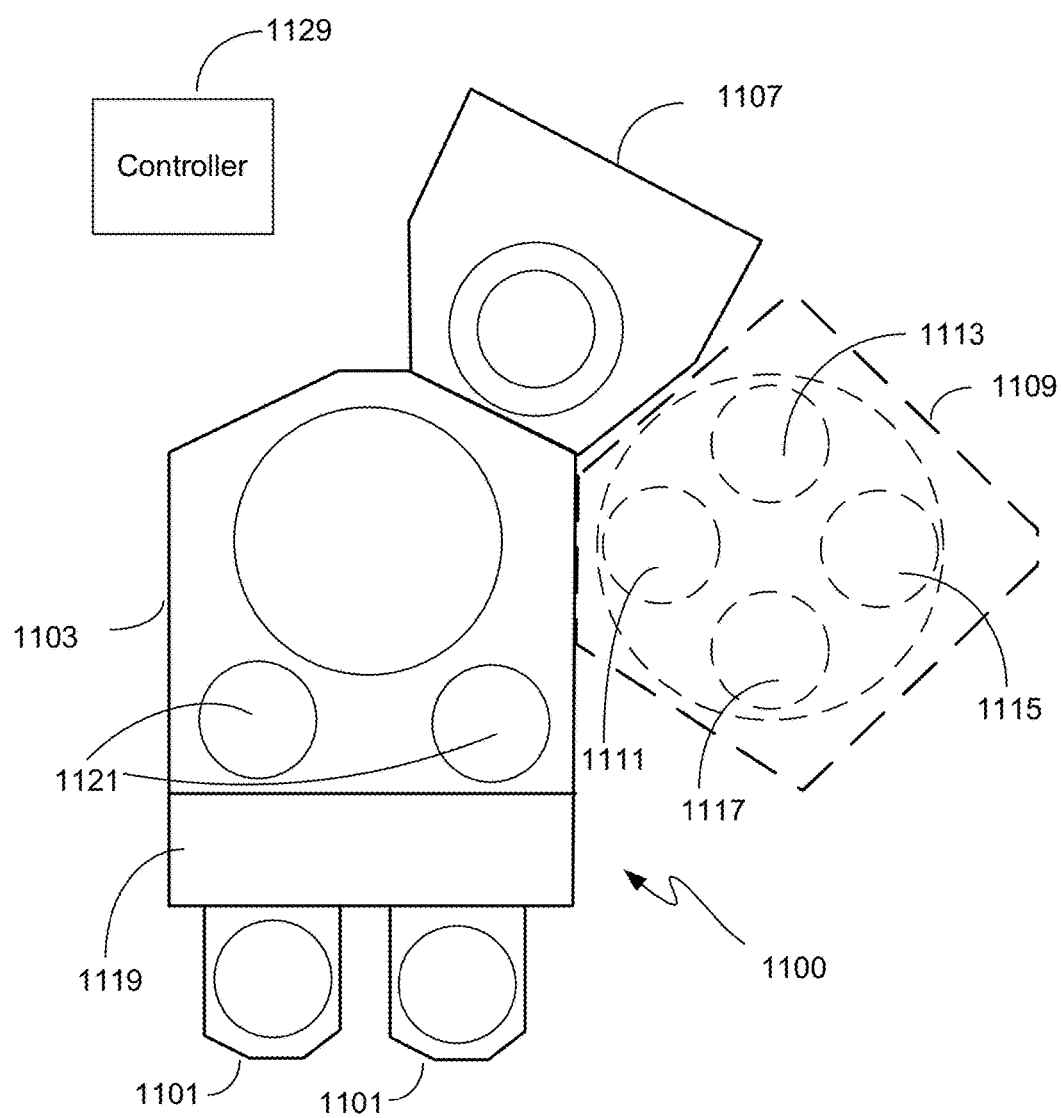

FIG. 11 is a block diagram of a processing system suitable for conducting deposition processes in accordance with embodiments described herein.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
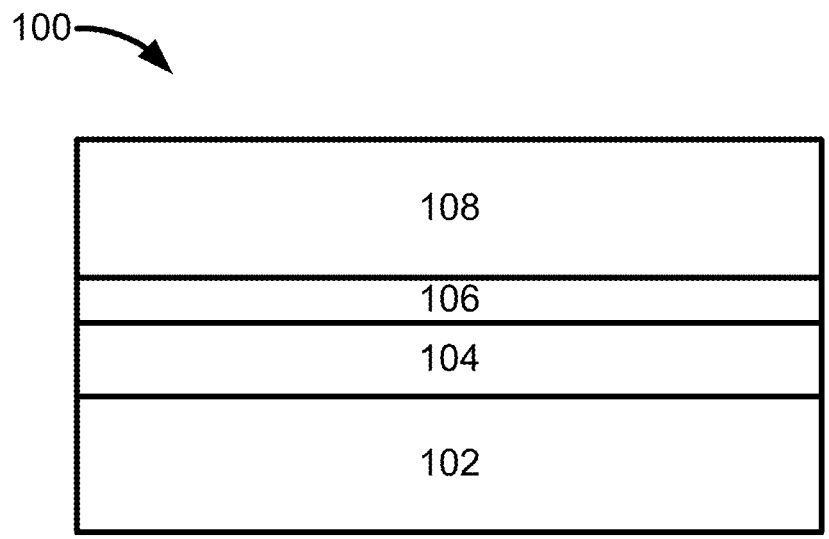
FIGS. 1A and 1B are schematic examples of material stacks that include molybdenum (Mo) according to various embodiments.
Figure 1B:
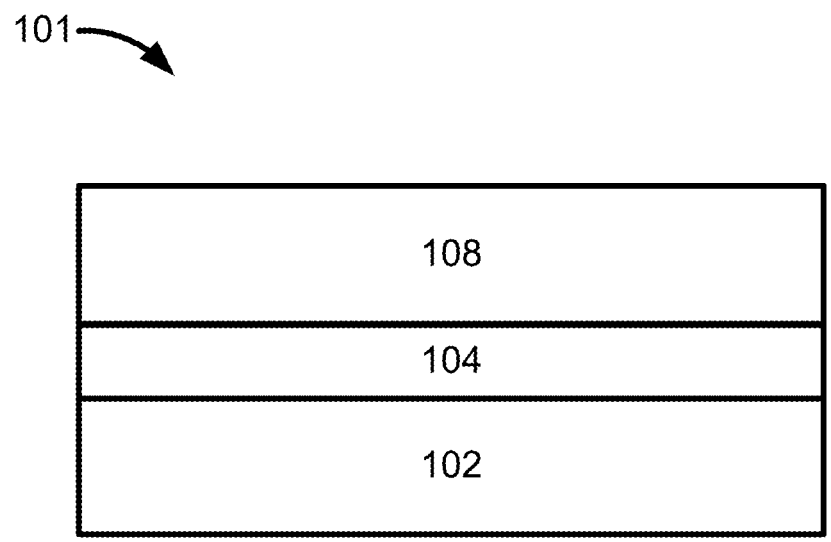

Provided herein are low resistance metallization stack structures for logic and memory applications. FIGS. 1A and 1B are schematic examples of material stacks that include molybdenum (Mo) according to various embodiments. FIGS. 1A and 1B illustrate the order of materials in a particular stack and may be used with any appropriate architecture and application, as described further below with respect to FIGS. 2 and 3. In the example of FIG. 1A, a substrate 102 has a Mo layer 108 is deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., Si) surface of the substrate 102, or there may be any number of intervening layers. Examples of dielectric layers include doped and undoped silicon oxide, silicon nitride, and aluminum oxide layers, with specific examples including doped or undoped layers $SiO_2$ and $Al_2O_3$. Also, in FIG. 1A, a diffusion barrier layer 106 is disposed between the Mo layer 108 and the dielectric layer 104. Examples of diffusion barrier layers including titanium nitride (TiN), titanium/titanium nitride (Ti/TiN), tungsten nitride (WN), and tungsten carbon nitride (WCN). Further examples diffusion barriers are multi-component Mo-containing films as described further below. The Mo layer 108 is the main conductor of the structure. As discussed further below, the Mo layer 108 may include a Mo nucleation layer and a bulk Mo layer. Further, in some embodiments, the Mo layer 108 may be deposited on a tungsten (W) or W-containing growth initiation layer.

FIG. 1B shows another example of a material stack. In this example, the stack includes the substrate 102, dielectric layer 104, with Mo layer 108 deposited on the dielectric layer 104, without an intervening diffusion barrier layer. As in the example of FIG. 1A, the Mo layer 108 may include a Mo nucleation layer and a bulk Mo layer, and, in some embodiments, the Mo layer 108 may be deposited on a tungsten (W) or W-containing growth initiation layer. By using Mo, which has a lower electron mean free path than W, as the main conductor, lower resistivity thin films can be obtained.

While FIGS. 1A and 1B show examples of metallization stacks, the methods and resulting stacks are not so limited. For example, in some embodiments, Mo may be deposited directly on a Si or other semiconductor substrate, with or without a W initiation layer.

Figure 2:
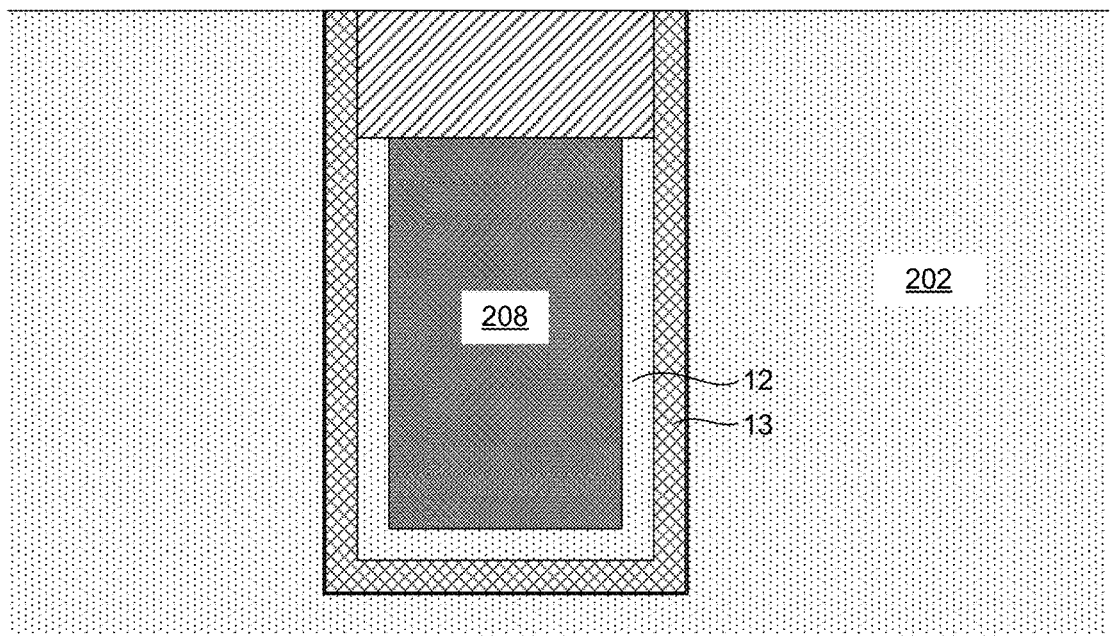
FIG. 2 depicts a schematic example of a DRAM architecture including a Mo buried wordline (bWL).
Figure 3A:
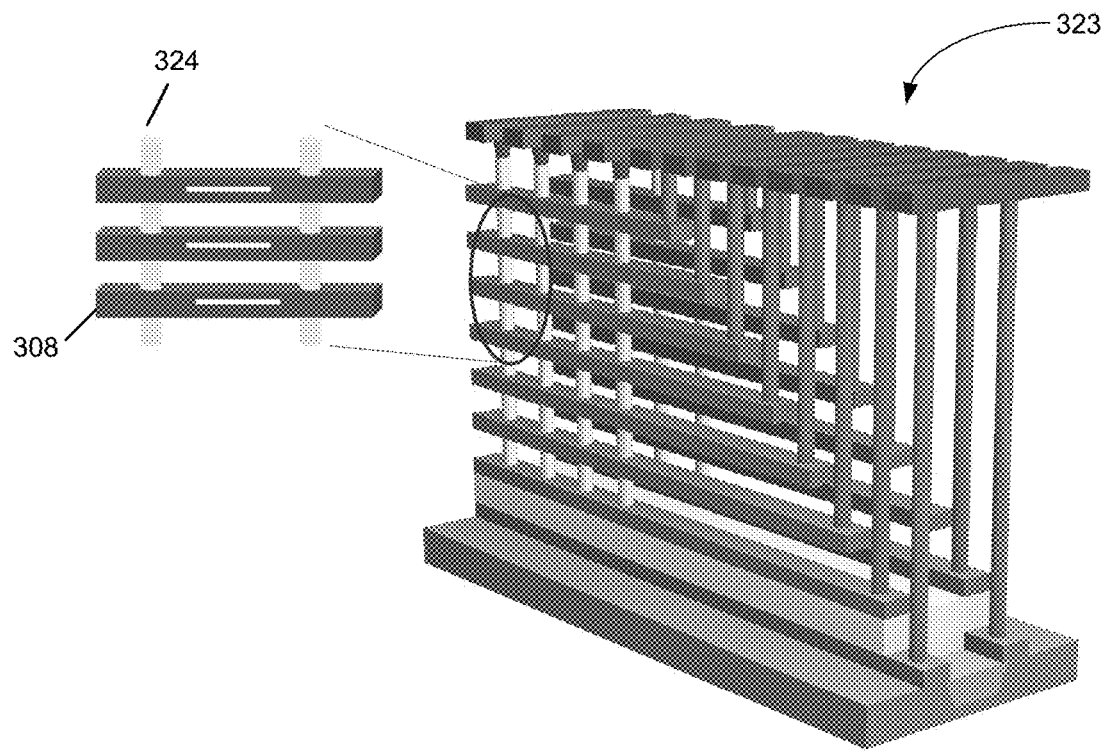
FIG. 3A depicts a schematic example of a Mo wordline in a 3D NAND structure.
Figure 3B:
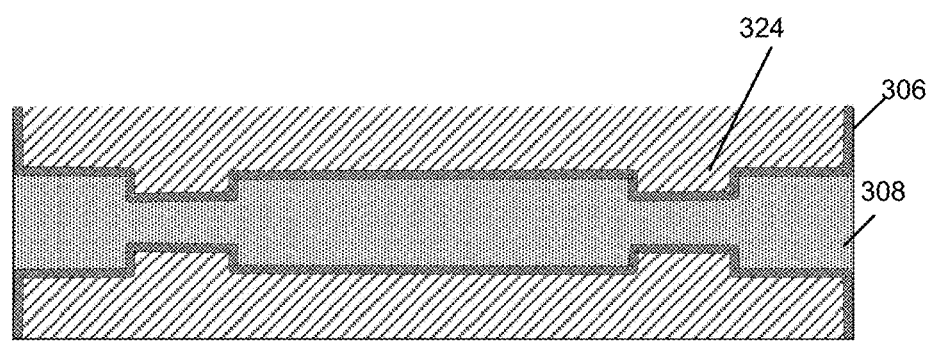
FIG. 3B depicts a 2-D rendering of 3-D features of a partially-fabricated 3D NAND structure after Mo fill including a Mo wordline and a conformal barrier layer.

The material stacks described above and further below may be employed in a variety of embodiments. FIGS. 2, 3A, and 3B provide examples of structures in which the Mo-containing stacks may be employed. FIG. 2 depicts a schematic example of a DRAM architecture including a Mo buried wordline (bWL) 208 in a silicon substrate 202. The Mo bWL is formed in a trench etched in the silicon substrate 202. Lining the trench is a conformal barrier layer 206 and an insulating layer 204 that is disposed between the conformal barrier layer 206 and the silicon substrate 202. In the example of FIG. 2, the insulating layer 204 may be a gate oxide layer, formed from a high-k dielectric material such as a silicon oxide or silicon nitride material. In some embodiments disclosed herein the conformal barrier layer is TiN or tungsten-containing layer. In some embodiments, it TiN is used as a barrier, a conformal tungsten-containing growth initiation layer may be present between the conformal barrier layer 206 and the Mo bWL 208. Alternatively, the Mo bWL 208 may be deposited directly on a TiN or other diffusion barrier.

FIG. 3A depicts a schematic example of a Mo wordline 308 in a 3D NAND structure 323. In FIG. 3B, a 2-D rendering of 3-D features of a partially-fabricated 3D NAND structure after Mo fill, is shown including the wordline 308 and a conformal barrier layer 306. FIG. 3B is a cross-sectional depiction of a filled area with the pillar constrictions 324 shown in the figure representing constrictions that would be seen in a plan rather than cross-sectional view. The conformal barrier layer 306 may be a TiN or tungsten-containing layer as described above with respect to the conformal barrier layer 206 in FIG. 2. In some embodiments, a tungsten-containing film may serve as a barrier layer and a nucleation layer for subsequent CVD Mo deposition as discussed below. If TiN is used as a barrier, a conformal tungsten-containing growth initiation layer may be present between the barrier and the wordline. Alternatively, the Mo wordline 308 may be deposited directly on a TiN or other diffusion barrier.

The methods of forming Mo-containing stacks include vapor deposition techniques such as CVD and pulsed nucleation layer (PNL) deposition. In a PNL technique, pulses of a co-reactant, optional purge gases, and Mo-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL may be used for deposition of Mo nucleation layers and/or W-based growth initiation layers in the methods described herein. A nucleation layer is typically a thin conformal layer that facilitates subsequent deposition of bulk material thereon. According to various implementations, a nucleation layer may be deposited prior to any fill of the feature and/or at subsequent points during fill of the feature.

PNL techniques for depositing tungsten nucleation layers are described in U.S. Pat. Nos. 6,635,965; 7,005,372; 7,141, 494; 7,589,017, 7,772,114, 7,955,972 and 8,058,170. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

In many implementations, deposition of the Mo bulk layer can occur by a CVD process in which a reducing agent and a Mo-containing precursor are flowed into a deposition chamber to deposit a bulk layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Mo-containing precursors include molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$). Organometallic precurors such as molybdenum silylcyclopentadienyl and molybdenum silylallyl complexes may be used. Mo-containing precursors may be halide precursors, which include $MoF_6$ and $MoCl_5$ as well as mixed halide precursors that have two or more halogens that can form a stable molecule. An example of a mixed halide precursor is $MoCl_xBr_y$ with x and y being any number greater than 0 that can form a stable molecule.

Mo-Containing Layer on a W-Based Growth Initiation Layer

In certain embodiments, structures including a molybdenum (Mo)-containing layer on a tungsten (W)-based growth initiation layer are provided. Also provided are methods of forming Mo-containing films.

The W-based growth initiation layer may be any W-containing layer. In some embodiments, it is a nucleation layer, i.e., a thin conformal layer that serves to facilitate the subsequent formation of a bulk material thereon. In some embodiments, the W-based growth initiation layer is a bulk W-containing layer, which itself may be deposited on a nucleation layer. When used for feature fill, a nucleation layer may be deposited to conformally coat the sidewalls and bottom of the feature. Conforming to the underlying feature bottom and sidewalls can be critical to support high quality deposition. According to various embodiments, the W-based growth initiation layer may be deposited by one or both of PNL and CVD. For example, a CVD layer may be deposited on a PNL layer.

In some embodiments, the W-containing layer is an elemental W layer. Such layers may be deposited by any appropriate methods include PNL or CVD methods. Elemental W is distinguished from binary films such as WC or WN and ternary films like WCN, though it may include some amount of impurities. It may be referred to as a W layer or W film.

In some embodiments, the W-based growth layer is a low resistivity W (LRW) film. Deposition of low resistivity tungsten according to certain embodiments is described in U.S. Pat. No. 7,772,114. In particular, the '114 patent describes exposing a PNL W nucleation layer to a reducing agent prior to CVD deposition of W on the PNL W layer. LRW films have large grain sizes that provide good templates for large Mo grain growth.

In some embodiments, the W-based growth layer is a PNL W nucleation layer deposited using one or more of a boron-containing reducing agent (e.g., $B_2H_6$) or a silicon-containing reducing agent (e.g., $SiH_4$) as a co-reactant. For example, one or more S/W cycles, where S/W refers to a pulse of silane followed by a pulse of tungsten hexafluoride ($WF_6$) or other tungsten-containing precursor, may be employed to deposit a PNL W nucleation layer on which a Mo layer is deposited. In another example, one or more B/W cycles, where B/W refers to a pulse of diborane followed by a pulse of $WF_6$ or other tungsten-containing precursor, may be employed to deposit a PNL W nucleation layer on which a Mo layer is deposited. B/W and S/W cycles may both be used to deposit a PNL W nucleation layer. Examples of PNL processes using one or both of a boron-containing reducing agent and a silicon-containing reducing agent are described in U.S. Pat. Nos. 7,262,125; 7,589,017; 7,772,114; 7,955,972; 8,058,170; 9,236,297 and 9,583,385.

In some embodiments, the W-based growth layer is a W layer or other W-containing layer deposited using a tungsten chloride ($WCl_x$) precursor such as tungsten hexachloride ($WCl_6$) or tungsten pentachloride ($WCl_5$). Deposition of W-containing layers using tungsten chlorides is described in U.S. Pat. No. 9,595,470; U.S. Patent Publication No. 20150348840; and U.S. patent application Ser. No. 15/398,462.

In some embodiments, the W-based growth layer is a low fluorine W layer. U.S. Pat. No. 9,613,818, describes sequential CVD methods of depositing a low-fluorine W layer. U.S. Patent Publication No. 2016/0351444 describes PNL methods of depositing low fluorine W layers.

In some embodiments, the W-based growth layer is a WN, WC, or WCN film. Methods of depositing one or more of WN, WC, or WCN are described in each of U.S. Pat. Nos. 7,005,372; 8,053,365; 8,278,216; and U.S. patent application Ser. No. 15/474,383.

The W-based growth layers are not limited to the examples given above, but may be any W or other W-containing film deposited by any appropriate method including ALD, PNL, CVD, or physical vapor deposition (PVD) methods. ALD, PNL, and CVD deposition involves exposure to a W-containing precursor. In addition to the $WF_6$ and $WCl_x$ precursors, examples of W-containing precursors include tungsten hexacarbonyl ($W(CO)_6$) and organo-metallic precursors such as MDNOW (methylcyclopentadienyl-dicarbonylnitrosyl-tungsten) and EDNOW (ethylcyclopentadienyl-dicarbonylnitrosyl-tungsten). In many ALD, PNL, and CVD deposition processes, a reducing agent is used to reduce the W-containing precursor. Examples include hydrogen gas ($H_2$), silane ($SiH_4$), disilane ($Si_2H_6$) hydrazine ($N_2H_4$), diborane ($B_2H_6$) and germane ($GeH_4$).

Also as noted above, the W-containing films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten. In some implementations, the films may be a mixture of elemental tungsten (W) and other tungsten-containing compounds such as WC, WN, etc.

The Mo-containing film may be deposited on the W-based growth initiation layer by any appropriate method including ALD or CVD. In some embodiments, sequential CVD processes may be used. Sequential CVD processes are described in U.S. Pat. No. 9,613,818, incorporated by reference herein.

Deposition of Mo-containing films may involve exposing the W-based growth initiation layer to a Mo-containing precursor and a reducing agent or other co-reactant, either simultaneously or sequentially. Examples of Mo-containing precursors include $MoF_6$, $MoCl_5$, $MoOCl_4$, and $Mo(CO)_6$. Organometallic precursors such as molybdenum silylcyclopentadienyl and molybdenum silylallyl complexes may be used. Mo film purity (e.g., as measured by O content) can be tuned by varying the precursor and co-reactant partial pressures.

Substrate temperature during Mo deposition may be between 300° C. to 750° C., and in particular embodiments, between 450° C. and 550° C. Substrate temperature will depend on the thermal budget and the deposition chemistry. Thermal budget depends on the applications, while high deposition temperature may not be an issue for memory applications, it can exceed the thermal budget for logic applications.

The presence of the W-containing growth initiation layer allows the deposition to be performed at lower temperatures. For example, Mo deposition from $MoCl_5$ or $MoOCl_4$ cannot be performed at temperatures less than 550° C. due to the strength of the Mo—Cl bond. However, with a W-containing growth initiation layer, the deposition can be performed at less than 550° C. Chamber pressure during Mo deposition may be, for example, 5 torr to 60 torr.

In some embodiments, $H_2$ is used as reducing agent, rather than a stronger reducing agent such $SiH_4$ or $B_2H_6$. These stronger reducing agents can result in an undesirable oxygen rich interface when using an oxygen-containing Mo-containing precursor. The Mo-containing film may an elemental Mo film, although such films may include some amount of other compounds, dopants and/or impurities depending on the particular precursors and processes used.

Mo-Containing Layer on a PNL-Deposited Mo Nucleation Layer

In certain embodiments, a Mo-containing layer may be deposited without the use of a W-based growth initiation layer. For example, an elemental Mo layer may be deposited on a TiN or dielectric layer. For certain precursors, deposition temperatures may be relatively high (above 550° C.) to obtain deposition. CVD deposition using chlorine-containing precursors such as $MoOCl_5$, $MoOCl_4$, and $MoO_2Cl_2$ may be performed at temperatures of greater than 550° C. on TiN and dielectric surfaces. At lower temperatures, CVD deposition may be performed on any surface using a W-based growth initiation layer as described above. Further, in some embodiments, CVD deposition may be performed on any surface using a Mo-containing nucleation layer deposited by a PNL process.

As described above, in a PNL process, pulses of a co-reactant, optional purge gases, and Mo-containing precursor are sequentially injected into and purged from the reaction chamber. In some embodiments, a Mo nucleation layer deposited using one or more of a boron-containing reducing agent (e.g., $B_2H_6$) or a silicon-containing reducing agent (e.g., $SiH_4$) as a co-reactant. For example, one or more S/Mo cycles, where S/Mo refers to a pulse of silane followed by a pulse of a Mo-containing precursor, may be employed to deposit a PNL Mo nucleation layer on which a CVD Mo layer is deposited. In another example, one or more B/Mo cycles, where B/Mo refers to a pulse of diborane followed by a pulse of a Mo-containing precursor, may be employed to deposit a PNL Mo nucleation layer on which a CVD Mo layer is deposited. B/Mo and S/Mo cycles may both be used to deposit a PNL Mo nucleation layer, e.g., x(B/Mo)+y(S/Mo), with x and y being integers. For PNL deposition of a Mo nucleation layers, in some embodiments, the Mo-containing precursor may be a non-oxygen containing precursor, e.g., $MoF_6$ or $MoCl_5$. Oxygen in oxygen-containing precursors may react with a silicon- or boron-containing reducing agent to form $MoSi_xO_y$ or $MoB_xO_y$, which are impure, high resistivity films. Oxygen-containing precursors may be used with oxygen incorporation minimized. In some embodiments, $H_2$ may be used as a reducing gas instead of a boron-containing or silicon-containing reducing gas. Example thicknesses for deposition of a Mo nucleation layer range from 5 Å to 30 Å. Films at the lower end of this range may not be continuous; however, as long as they can help initiate continuous bulk Mo growth, the thickness may be sufficient. In some embodiments, the reducing agent pulses may be done at lower substrate temperatures than the Mo precursor pulses. For example, or $B_2H_6$ or a $SiH_4$ (or other boron- or silicon-containing reducing agent) pulse may be performed at a temperature below 300° C., with the Mo pulse at temperatures greater than 300° C.

Mo Deposition Using a Reducing Agent Layer

Deposition at lower temperatures (below 550° C.) may also be performed directly on non-W surfaces such as dielectric and TiN surfaces by a process as shown in FIG. 4A. It may also be used on W-containing surfaces. FIG. 4A provides a process flow diagram for a method performed in accordance with disclosed embodiments. Operations 402-408 of FIG. 4A may be performed to form a conformal Mo layer directly at least a dielectric surface or other surface.

In operation 402, the substrate is exposed to a reducing agent gas to form a reducing agent layer. In some embodiments, the reducing agent gas may be a silane, a borane, or a mixture of a silane and diborane. Examples of silanes including $SiH_4$ and $Si_2H_6$ and examples of boranes include diborane ($B_2H_6$), as well as $B_nH_{n+4}$, $B_nH_{n+6}$, $B_nH_{n+8}$, $B_nH_m$, where n is an integer from 1 to 10, and m is a different integer than m. Other boron-containing compounds may also be used, e.g., alkyl boranes, alkyl boron, aminoboranes $(CH_3)_2NB(CH_2)_2$, carboranes such as $C_2B_nH_{n+2}$. In some implementations, the reducing agent layer may include silicon or silicon-containing material, phosphorous or a phosphorous-containing material, germanium or a germanium-containing material, boron or boron-containing material that is capable of reducing a tungsten precursor and combinations thereof. Further example reducing agent gases that can be used to form such layers include $PH_3$, $SiH_2Cl_2$, and $GeH_4$. According to various embodiments, hydrogen may or may not be run in the background. (While hydrogen can reduce tungsten precursors, it does not function as a reducing agent in a gas mixture with a sufficient amount of stronger reducing agents such as silane and diborane.)

In some embodiments, the reducing agent gas is a mixture including a small amount of a boron-containing gas, such as diborane, with another reducing agent. The addition of a small amount of a boron-containing gas can greatly affect the decomposition and sticking coefficient of the other reducing agent. It should be noted that exposing the substrate sequentially to two reducing agents, e.g., silane and diborane may be performed. However, flowing a mixture of gases can facilitate the addition of very small amounts of a minority gas, e.g., at least a 100:1 ratio of silane to diborane. In some embodiments, a carrier gas may be flowed. In some embodiments, a carrier gas, such as nitrogen ($N_2$), argon (Ar), helium (He), or other inert gases, may be flowed during operation 402.

In some embodiments, a reducing agent layer may include elemental silicon (Si), elemental boron (B), elemental germanium (Ge), or mixtures thereof. For example, as described below, a reducing agent layer may include Si and B. The amount of B may be tailored to achieve high deposition rate of the reducing agent layer but with low resistivity. In some embodiments, a reducing agent layer may have between 5% and 80% B for example, or between 5% and 50% B, between 5% and 30%, or between 5% and 20% B, with the balance consisting essentially of Si and in some cases, H. Hydrogen atoms be present, e.g., $SiH_x$, $BH_y$, $GeH_z$, or mixtures thereof where x, y, and z may independently be between 0 and a number that is less than the stoichiometric equivalent of the corresponding reducing agent compound.

In some embodiments, the composition may be varied through the thickness of the reducing agent layer. For example, a reducing agent layer may be 20% B at the bottom of the reducing agent layer and 0% B the top of the layer. The total thickness of the reducing agent layer may be between 10 Å and 50 Å, and is some embodiments, between 15 Å and 40 Å, or 20 Å and 30 Å. The reducing agent layer conformally lines the feature.

Substrate temperature during operation 402 may be maintained at a temperature T1 for the film to be conformal. If temperature is too high, the film may not conform to the topography of the underlying structure. In some embodiments, step coverage of greater than 90% or 95% is achieved. For silane, diborane, and silane/diborane mixtures, conformality is excellent at 300° C. and may be degraded at temperatures of 400° C. or higher. Thus, in some embodiments, temperature during operation 202 is at most 350° C., or even at most 325° C., at most 315° C., or at most 300° C. In some embodiments, temperatures of less than 300° C. are used. For example, temperatures may be as low as 200° C.

Operation 402 may be performed for any suitable duration. In some examples, Example durations include between about 0.25 seconds and about 30 seconds, about 0.25 seconds and about 20 seconds, about 0.25 seconds and about 5 seconds, or about 0.5 seconds and about 3 seconds.

In operation 404, the chamber is optionally purged to remove excess reducing agent that did not adsorb to the surface of the substrate. A purge may be conducted by flowing an inert gas at a fixed pressure thereby reducing the pressure of the chamber and re-pressurizing the chamber before initiating another gas exposure. Example inert gases include nitrogen ($N_2$), argon (Ar), helium (He), and mixtures thereof. The purge may be performed for a duration between about 0.25 seconds and about 30 seconds, about 0.25 seconds and about 20 seconds, about 0.25 seconds and about 5 seconds, or about 0.5 seconds and about 3 seconds.

In operation 406, the substrate is exposed to a Mo-containing precursor at a substrate temperature T2. Examples of Mo-containing compounds are given above and include chlorides and oxychlorides. Use of oxygen-containing precursors can lead to impurity incorporation and higher resistivity. However, if oxygen is incorporated, a very thin, possibly discontinuous reducing agent layer may be used for an acceptable resistivity. In some embodiments, a carrier gas, such as nitrogen ($N_2$), argon (Ar), helium (He), or other inert gases, may be flowed during operation 406. Examples of temperatures are 500° C. to 700° C.

Operation 406 may be performed for any suitable duration. In some embodiments, it may involve a soak of the Mo-containing precursor and in some embodiments, a sequence of Mo-containing precursor pulses. According to various embodiments, operation 406 may or may not be performed in the presence of $H_2$. If $H_2$ is used, in some embodiments, it and the Mo-containing precursor may be applied in an ALD-type mode. For example:

Pulse of $H_2$
Argon purge
Pulse of Mo-containing precursor with or without $H_2$ in background
Argon purge
Repeat The substrate temperature T2 is high enough that the Mo-containing precursor reacts with the reducing agent layer to form elemental Mo. The entire reducing agent layer is converted to Mo. In some embodiments, the temperature is at least 450° C., and may be at least 550° C. to obtain conversion of at or near 100%. The resulting feature is now lined with a conformal film of Mo. It may be between 10 Å and 50 Å, and is some embodiments, between 15 Å and 40 Å, or 20 Å and 30 Å. In general, it will be about the same thickness as the reducing agent layer. In some embodiments, it may be may be up to 5% thicker than the reducing agent layer due to volumetric expansion during the conversion. In some embodiments, a CVD Mo layer may be deposited on the conformal Mo layer.

Multi-Component Mo Film

In some embodiments, a multi-component Mo-containing film is provided. In some such embodiments, the multi-component Mo-containing film may include one or more of boron (B), silicon (Si), or germanium (Ge). FIG. 4B provides a process flow diagram for a method performed in accordance with disclosed embodiments.

First, a substrate is exposed to a reducing agent pulse (452). In some embodiments, a surface that is exposed to the reducing agent pulse on which the film is formed is a dielectric. According to various embodiments, the film may be formed on other types of surfaces including conducting and semiconducting surfaces.

The reducing agent employed in block 452 will reduce a Mo-containing precursor employed in a subsequent operation as well as provide a compound to be incorporated into the resulting film. Examples of such reducing agents include boron-containing, silicon-containing, and germanium-containing reducing agents. Examples of boron-containing reducing agents include boranes such as $B_nH_{n+4}$, $B_nH_{n+6}$, $B_nH_{n+8}$, $B_nH_m$, where n is an integer from 1 to 10, and m is a different integer than m. In particular examples, diborane may be employed. Other boron-containing compounds may also be used, e.g., alkyl boranes, alkyl boron, aminoboranes $(CH_3)_2NB(CH_2)_2$, and carboranes such as $C_2B_nH_{n+2}$. Examples of silicon-containing compounds include silanes such as $SiH_4$ and $Si_2H_6$. Examples of germanium-containing compounds include germanes, such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, e.g., alkyl germanes, alkyl germanium, aminogermanes and carbogermanes.

According to various embodiments, block 452 may involve adsorption of a thin layer of thermally decomposed elemental boron, silicon, or germanium onto the surface of the substrate. In some embodiments, block 452 may involve adsorption of a precursor molecule onto substrate surface.

Next, the chamber in which the substrate sits may be optionally purged (454). A purge pulse or an evacuation can be employed to remove any byproduct, if present, and unadsorbed precursor. This is followed by a pulse of a Mo-containing precursor (456). In some embodiments, the Mo-containing precursor is a Cl-containing precursor such as $MoOCl_4$, $MoO_2Cl_2$, and $MoCl_5$. An optional purge (457) may be performed after block 456 as well. The Mo-containing precursor is reduced by the reducing agent (or a decomposition or reaction product thereof) to form the multi-component film.

A deposition cycle will typically deposit a portion of the Mo-containing layer. After block 457, a deposition cycle may be complete in some implementations with the deposited film being a tungsten-containing binary film such as $MoB_x$, $MoSi_x$, and $MoGe_x$, where x is greater than zero. In such embodiments, the process may proceed to block 462 with repeating the cycle of blocks 452-457 until the desired thickness is deposited. Example growth rates may be about 100 Å per cycle.

In some embodiments, the process will proceed with optionally introducing a third reactant (458). The third reactant will generally contain an element to be introduced into the film, such as carbon or nitrogen. Examples of nitrogen-containing reactants include $N_2$, $NH_3$, and $N_2H_4$. Examples of carbon-containing reactants include $CH_4$ and $C_2H_2$. An optional purge (459) may follow. The process may then proceed to block 462 with repeating the deposition cycle.

Examples of ternary films including nitrogen or carbon are given above. In some embodiments, a film may include both nitrogen and carbon (e.g., MoSiCN).

According to various embodiments, the multi-component tungsten film may have the following atomic percentages: Mo about 5% to 90%, B/Ge/Si about 5% to 60%, C/N about 5% to 80%. In some embodiments, the multi-component films have the following atomic percentages: Mo about 15% to about 80%; B/Ge/Si: about 15% to about 50%; and C/N about 20% to about 50%. According to various embodiments, the multi-component Mo film is at least 50% Mo.

According to various embodiments, the deposition is relatively high, e.g., between 500° C. and 700° C., including between 550° C. and 650° C., and in some embodiments greater than about 500° C. This facilitates Mo-containing precursor reduction and also permits incorporation of B, Si, or Ge into the binary film. The high end of the range may be limited by thermal budget considerations. In some embodiments, any one or more of blocks 452, 456, and 458 may be performed at a different temperature than any of the other blocks. In certain embodiments, transitioning from block 452 to block 456 and from block 456 to block 458 involves moving the substrate from one deposition station to another in a multi-station chamber. Still further, each of block 452, block 456, and block 458 may be performed in a different station of the same multi-station chamber. In some embodiments, the order of blocks 452, 456, and 458 may be changed.

In some embodiments, electrical properties such as work function of the binary or ternary film may be tuned by introducing nitrogen or carbon. Similarly, the amount of reducing agent may be modulated (by modulating dosage amount and/or pulse time) to tune the amount of B, Si, or Ge that is incorporated into the film. Still further, any one or two of blocks 452, 456 and 458 may be performed more than once per cycle to tune the relative amounts of the tungsten and the other components of the binary or ternary films and thus their physical, electrical, and chemical characteristics. The multi-component layer may include Mo, one or more of B, Si, and Ge, and, optionally, one or more of C and N. Examples include $MoB_x$, $MoSi_x$, $MoGe_x$, $MoB_xN_y$, $MoSi_xN_y$, $MoGe_xN_y$, $MoSi_xC_y$, $MoB_xC_y$, $MoGe_xC_y$, where x and y are greater than zero.

It should be noted that in the process described with reference to FIG. 4B, an element in the reducing agent (B, Si, or Ge) is deliberately incorporated into the Mo-containing film. This is in contrast to certain PNL and CVD deposition processes described above and certain embodiments of the deposition process described in FIG. 4B in which a B-containing, Si-containing, or Ge-containing reducing agent may be used to form an element Mo film that has none of or only trace amounts of these elements. Incorporation of B, Ge, or Si can be controlled by the pulse duration and dosage amount. Further, in some embodiments, higher temperatures may be employed to increase incorporation. If the temperature is too high, it can result in uncontrolled decomposition of the reactant gas. In some embodiments, the substrate temperature may be lower temperature for the reducing agent gas and a higher temperature for the Mo precursor, as described above with respect to FIG. 4A.

In some embodiments, the process in FIG. 4B may be modified such that B, Si, or Ge is not incorporated into the film, but block 458 is performed to incorporate C and/N, e.g., to form MoC, MoN, or MoCN films. A C- and/or N-containing reactant may be used in such embodiments.

In some embodiments, the multi-component Mo-containing film is a diffusion barrier, e.g., for a wordline. In some embodiments, the multi-component tungsten-containing film is a work function layer for a metal gate. In some embodiments, a bulk Mo layer may deposited on the multi-component layer. The bulk layer may be deposited directly on the multi-component Mo-containing film without an intervening layer in some embodiments. In some embodiments, it may be deposited by CVD.

Experimental

CVD Mo films were grown on tungsten nucleation layers deposited by PNL using silane and diborane, respectively, to reduce $WF_6$. The silane-deposited tungsten nucleation layer is referred to as a SW nucleation layer, and the diborane-deposited tungsten nucleation layer is referred to as a BW nucleation layer. Mo films were deposited from $MoOCl_4$ and $H_2$.

30 Torr and 45 Torr process pressures were compared for each deposition. No Mo deposition and some W loss was observed at 30 Torr, with more W loss observed for BW nucleation than SW nucleation. Secondary ion mass spectrometry (SIMS) data showed O content at less than 1 atomic %.

Mo was deposited by CVD on SW nucleation layers and BW nucleation layers at different temperatures (500° C. and 520° C.), pressures (45 Torr and 60 Torr). The number of BW or SW cycles use to deposit the nucleation layer was also varied (1, 2, 3 or 4). FIGS. 5 and 6 show Mo thickness (Angstroms) vs. CVD Duration (seconds) and Mo Resistivity ($\mu\Omega$-cm) vs Mo thickness (Angstroms), respectively.

Lower resistivity is observed at 60 Torr process pressure than at 45 Torr. No significant difference between 500° C. and 520° C. at 60 Torr was observed. For comparable BW nucleation layer and SW nucleation layer thicknesses, lower resistivity was observed on the SW nucleation layers. Higher resistivity was observed on thinner (fewer cycles) SW nucleation layers.

Mo was deposited by CVD on WCN at different temperatures (500° C. and 520° C.) and pressures (45 Torr and 60 Torr). FIG. 7 shows Mo growth rate and FIG. 8 shows resistivity vs Mo film thickness. FIG. 9 shows thickness and resistivity as a function of WCN underlayer thickness. WCN etching was observed at 45 Torr whereas uniform Mo deposition was observed at 60 Torr. At 60 Torr, a higher growth rate at 520° C. was observed, with temperature not impacting resistivity. Mo was grown on WCN as thin as 10 Angstroms, with thinner WCN resulting in lower resistivity. SIMS data showed that CVD Mo on WCN was smooth with less than 0.5 (atomic) % total impurities (e.g., O, B, C) in the bulk.

In some embodiments, Mo may be deposited selectively on a metal or pure (no native oxide) Si surface with respect to dielectric underlayers. For example, for metal contact or middle of line (MOL) logic applications, Mo can be grown selectively on metal, resulting in bottom-up, void free gap fill. In such applications, the Mo may be deposited directly on a metal or Si surface that is adjacent an exposed silicon dioxide or other exposed dielectric surface. The nucleation delay on the dielectric is such that the Mo is deposited preferentially on the metal surface. For example, a feature having a metal bottom and silicon dioxide sidewalls may be exposed to a Mo-containing precursor and a co-reactant. Mo will grow from the bottom-up rather than from the sidewalls.

Anneal

In some embodiments, a thermal anneal is performed after Mo deposition. This can allow Mo grain growth and lower resistivity. Because the melting point of Mo is lower than that of W, grain growth and the accompanying decrease in resistivity occur at lower temperatures for Mo films. Examples of anneal temperatures range from 700° C. to 1100° C. The anneal may be performed in a furnace or by rapid thermal annealing. According to various embodiments, it may be performed in any appropriate ambient, including a hydrogen ($H_2$) ambient, a nitrogen ($N_2$) ambient, or vacuum.

According to various embodiments, the Mo film may or may not be exposed to air between deposition and annealing. If it is exposed to air or other oxidizing environment, a reducing environment may be employed during or before anneal to remove molybdenum dioxide ($MoO_2$) or molybdenum trioxide ($MoO_3$) that has formed as a result of the exposure. $MoO_3$ in particular has a melting point of 795° C. and could melt during anneal if not removed.

Table 1, below, compares two W films (A and B) and two Mo films (C and D)

In some embodiments, a tungsten nucleation process is performed at a first station that is one of two, five, or even more deposition stations positioned within a single deposition chamber. In some embodiments, various steps for the nucleation process are performed at two different stations of a deposition chamber. For example, the substrate may be exposed to diborane ($B_2H_6$) in a first station using an individual gas supply system that creates a localized atmosphere at the substrate surface, and then the substrate may be transferred to a second station to be exposed to a precursor such as tungsten hexachloride ($WCl_6$) to deposit the nucleation layer. In some embodiments, the substrate may then be transferred back to the first station for a second exposure of diborane or to a third station for a third reactant exposure. Then the substrate may be transferred to the second station for exposure to $WCl_6$ (or other tungsten chloride) to complete tungsten nucleation and proceed with bulk molybdenum deposition in the same or different station. One or more stations can then be used to perform Mo chemical vapor deposition (CVD) as described above.

FIG. 11 is a block diagram of a processing system suitable for conducting deposition processes in accordance with

|  | A | B | C | D |
|---|---|---|---|---|
| Resistivity | 20 µΩ-cm at 20 nm | 28 µΩ-cm at 20 nm<br>40 µΩ-cm at 10 nm | 25 µΩ-cm at 10 nm | 17 µΩ-cm at 10 nm<br>(after 800 C. anneal) |
| Composition | <3E18 at/cm³ F | <5E18 at/cm³ Cl,<br>F below detection limit | 95% Mo + 5% H,<br><1E19 at/cm³ Cl | <1% O,<br><1E19 at/cm³ Cl |
| Stress | <0.55 Gpa @ 20 nm | <0.2 Gpa @ 20 nm | 0.4 GPa @ 70 nm | 0.6 GPa @ 30 nm |

Film A is a low fluorine tungsten (LFW) film deposited using $WF_6$. Film B is a tungsten film deposited using $WCl_5$ and $WCl_6$. Film C is a molybdenum film deposited using $MoCl_5$ and film D is a molybdenum film deposited using $MoOCl_4$. Film D was subject to a post-deposition anneal. Notably, the resistivity is lower for Films C and D than films A and B. Resistivity decreases with thickness, with the 25 µΩ-cm (film C) and 17 µΩ-cm (film D) directly comparable to the 40 µΩ-cm (film A). Film D, deposited with an O-containing precursor, shows low O. The stress of films C and D is comparable to that of films A and B.

FIG. 10 is a graph showing the reduction in resistivity for Mo films of various thicknesses deposited on WCN after anneal at 800° C. Resistivity of a W film on WCN is also shown for comparison. A significant decrease in resistivity is observed. The decrease in resistivity is due to grain growth. Table 2, below, shows phases and average grain size for Mo grains in as deposited and post-anneal CVD Mo films.

| Sample | Phase | Average Crystallite Size (nm) |
|---|---|---|
| CVD Mo/WCN as deposited | Mo—Molybdenum Cubic | 14.5 |
| CVD Mo/WCN post-anneal | Mo—Molybdenum Cubic | 33.5 |

Furnace anneals of 1 hour and 5 mins at 800° C. in $H_2$ ambient showed comparable results.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. The process can be performed on multiple deposition stations in parallel.

embodiments described herein. The system 1100 includes a transfer module 1103. The transfer module 1103 provides a clean, pressurized environment to minimize the risk of contamination of substrates being processed as they are moved between the various reactor modules. Mounted on the transfer module 1103 is a multi-station reactor 1109 capable of performing nucleation layer deposition, which may be referred to as pulsed nucleation layer (PNL) deposition, as well as CVD deposition according to embodiments described herein. Chamber 1109 may include multiple stations 1111, 1113, 1115, and 1117 that may sequentially perform these operations. For example, chamber 1109 could be configured such that stations 1111 and 1113 perform PNL deposition, and stations 1113 and 1115 perform CVD. Each deposition station may include a heated wafer pedestal and a showerhead, dispersion plate or other gas inlet.

Also mounted on the transfer module 1103 may be one or more single or multi-station modules 1107 capable of performing plasma or chemical (non-plasma) pre-cleans. The module may also be used for various other treatments, e.g., reducing agent soaking. The system 1100 also includes one or more (in this case two) wafer source modules 1101 where wafers are stored before and after processing. An atmospheric robot (not shown) in the atmospheric transfer chamber 1119 first removes wafers from the source modules 1101 to loadlocks 1121. A wafer transfer device (generally a robot arm unit) in the transfer module 1103 moves the wafers from loadlocks 1121 to and among the modules mounted on the transfer module 1103.

In certain embodiments, a system controller 1129 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

In some implementations, a controller 1129 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1129, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1129, in some implementations, may be a part of or coupled to a computer that is integrated with, coupled to the system, otherwise networked to the system, or a combination thereof. For example, the controller 1129 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 1129 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the disclosure in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
    depositing a tungsten (W)-containing layer on a substrate by reacting a W-containing precursor with a reducing agent, wherein the reducing agent is a silicon (Si)-containing compound or a boron (B)-containing compound; and
    depositing a molybdenum (Mo)-containing layer on the W-containing layer, wherein the Mo-containing layer is deposited by exposing the W-containing layer to a reducing agent and a Mo-containing precursor and wherein the substrate is exposed to the reducing agent at first substrate temperature and is exposed to the Mo-containing precursor at a second substrate temperature, wherein the first substrate temperature is less than the second substrate temperature.

2. The method of claim 1, wherein the W-containing layer is a WCN layer or a W nucleation layer.

3. The method of claim 1, wherein the W-containing precursor is a tungsten chloride precursor.

4. The method of claim 1, wherein the Mo-containing layer is a Mo layer having less than 1 (atomic) % impurities.

5. The method of claim 1, further comprising thermally annealing the Mo-containing layer.

6. The method of claim 1, wherein the Mo-containing precursor selected from: molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$).

7. The method of claim 1, wherein a substrate temperature during exposure to the Mo-containing precursor is less than 550° C.

8. The method of claim 1, wherein the reducing agent is a mixture of a boron-containing reducing agent and a silicon-containing reducing agent.

9. A method comprising:
    flowing a reducing agent gas to a process chamber housing a substrate at a first substrate temperature to form a conformal reducing agent layer on the substrate; and
    exposing the conformal reducing agent layer to a molybdenum-containing precursor at a second substrate temperature to convert the conformal reducing agent layer to molybdenum.

10. The method of claim 9, wherein the reducing agent gas comprises one or more of a silicon-containing compound and a boron-containing compound.

11. The method of claim 10, wherein the first substrate temperature is less than the second substrate temperature.

12. The method of claim 10, wherein the reducing agent gas is a mixture of a boron-containing reducing agent and a silicon-containing reducing agent.

13. The method of claim 10, wherein the first substrate temperature is no more than 400° C. and the second substrate temperature is at least 500° C.

14. The method of claim 10, further comprising annealing the molybdenum.

15. A method comprising:
pulsing a reducing agent, wherein the reducing agent is boron (B)-containing, silicon (Si)-containing or germanium (Ge)-containing; and
pulsing a Mo-containing precursor,
wherein the Mo-containing precursor is reduced by the reducing agent or a product thereof to form a multi-component molybdenum-containing film containing one or more of B, Si, and Ge on a substrate.

16. The method of claim 15, wherein the multi-component molybdenum-containing film contains between 5% and 60% (atomic) B, Si, or Ge, and wherein the between 5% and 60% (atomic) B, Si, or Ge is provided by the reducing agent.

17. The method of claim 10, wherein the conformal reducing agent layer is formed on a tungsten (W)-containing layer.

18. The method of claim 17, wherein the W-containing layer is a WCN layer or a W nucleation layer.

19. The method of claim 11, wherein the reducing agent gas comprises one or more of a boron-containing reducing agent and a silicon-containing reducing agent.

20. The method of claim 10, wherein the molybdenum-containing precursor is selected from: molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$).

* * * * *